(12) United States Patent
Narus et al.

(10) Patent No.: US 7,801,258 B2
(45) Date of Patent: Sep. 21, 2010

(54) ALIGNING TIMEBASES TO SHARE SYNCHRONIZED PERIODIC SIGNALS

(75) Inventors: Gabriel L. Narus, Austin, TX (US); Craig M. Conway, Leander, TX (US)

(73) Assignee: National Instruments Corporation, Austin, TX (US)

( * ) Notice: Subject to any disclaimer, the term of this patent is extended or adjusted under 35 U.S.C. 154(b) by 741 days.

(21) Appl. No.: 11/695,139

(22) Filed: Apr. 2, 2007

(65) Prior Publication Data

US 2008/0240321 A1 Oct. 2, 2008

(51) Int. Cl.
*H04L 7/00* (2006.01)
(52) U.S. Cl. ..................................... 375/356
(58) Field of Classification Search ............... 375/356, 375/376, 371; 370/465, 389, 470; 331/78
See application file for complete search history.

(56) References Cited

U.S. PATENT DOCUMENTS

| | | | |
|---|---|---|---|
| 5,699,016 A | 12/1997 | Federspiel et al. |
| 5,896,055 A | 4/1999 | Toyonaga et al. |
| 5,940,608 A | 8/1999 | Manning |
| 6,057,724 A | 5/2000 | Wann |
| 6,111,925 A | 8/2000 | Chi |
| 6,236,277 B1 | 5/2001 | Esker |
| 6,393,080 B1 | 5/2002 | Kamoshida et al. |
| 6,570,456 B2 | 5/2003 | Mano et al. |
| 6,661,859 B1 | 12/2003 | Wu |
| 6,757,304 B1 | 6/2004 | Nomura et al. |
| 6,857,081 B2 | 2/2005 | Pohlman |
| 6,934,868 B2 | 8/2005 | Morrison et al. |
| 6,946,886 B2 | 9/2005 | Isomura |

(Continued)

OTHER PUBLICATIONS

Eidson, John; "IEEE-1588 Standard Version 2—A Tutorial"; Agilent Technologies; Oct. 2, 2006; 21 pages.

(Continued)

*Primary Examiner*—Khai Tran
(74) *Attorney, Agent, or Firm*—Meyertons Hood Kivlin Kowert & Goetzel, P.C.; Jeffrey C. Hood

(57) ABSTRACT

A system and method for aligning a local timebase to a remote timebase given a timebase error value from a higher-level protocol, and using the aligned timebases to generate and distribute synchronized events and synchronized adjustable frequency periodic signals across a domain using the aligned timebases. Slightly speeding up or slowing down a periodic signal used to count time, a local timebase may be aligned to a remote timebase when given an error value from a higher-level protocol. A device may be configured to begin generating a periodic waveform at an agreed upon time in the future, once the timebases are aligned, where the time may be synchronized to remote devices via a synchronization protocol and an alignment mechanism. Remote periodic signals may remain synchronized to each other as long as the higher-level protocol and timebase alignment algorithm keep the timebases aligned. A common reference periodic signal may be shared between all devices, and the reference periodic signal or a conditioned version of the reference periodic signal may be specified as the periodic signal to control the operation of the timebase circuitry. The common reference periodic signal may improve synchronization performance beyond the capabilities of the higher-level protocol, and may in addition provide means for synchronization fault tolerance.

34 Claims, 4 Drawing Sheets

U.S. PATENT DOCUMENTS

| | | |
|---|---|---|
| 6,981,061 B1 | 12/2005 | Sakakura |
| 7,028,206 B2 | 4/2006 | Waller |
| 7,174,475 B2 | 2/2007 | Lee et al. |
| 7,187,742 B1 | 3/2007 | Logue et al. |
| 7,308,062 B2 | 12/2007 | Joo et al. |
| 2002/0163932 A1* | 11/2002 | Fischer et al. ............... 370/465 |
| 2005/0254824 A1 | 11/2005 | Bode |
| 2006/0224048 A1* | 10/2006 | Devaul et al. ............... 600/300 |
| 2007/0018704 A1 | 1/2007 | Ishii et al. |
| 2008/0065922 A1 | 3/2008 | Dour et al. |
| 2008/0152062 A1 | 6/2008 | Kocaman et al. |

OTHER PUBLICATIONS

"DDS v5.0 Product Specification"; Xilinx LogiCore; Apr. 28, 2005; 26 pages.

\* cited by examiner

ALIGNING TIMEBASES TO SHARE SYNCHRONIZED PERIODIC SIGNALS

FIELD OF THE INVENTION

The present invention relates to the field of periodic signal distribution and synchronization in measurement and/or control systems, and more particularly to a system and method for aligning timebases to share synchronized periodic signals.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

In some cases, computerized instrumentation systems include several instrumentation and/or DAQ devices. Each device may generate and/or capture data based on a sampling clock. A sampling clock in this context is typically defined as a periodic electrical signal that controls a function. For example, the sampling clock on an arbitrary waveform generator may drive a DAC (Digital to Analog Converter). Two or more devices may be considered being digitally synchronized when their data capture and/or data generation circuits line up within a cycle of the sampling clock. Digital synchronization may occur when the respective sampling clock of each device to be synchronized has substantially the same frequency (e.g. the sampling clocks of the devices may experience instantaneous frequency differences, but on average they may not drift relative to each other). In addition, for digital synchronization, the devices to be synchronized would preferably have the ability to respond to a trigger within the same period of the sampling clock, and in the case these devices are output devices, to output their data to a connector at substantially the same time. As described herein, two clocks are considered to be in phase when they are measured as having substantially the same frequency and substantially zero degrees of phase difference. In general, distributed measurement and control systems often require their composite parts to be aligned to the same timebase. One useful result of synchronization in these applications is the sharing of synchronized periodic signals. The signals can be used to take measurements at the same time or to provide known relationships between control units in a distributed environment.

If the sampling clock frequency for a set of devices is chosen to be an integer multiple of a reference clock signal received by all of the devices in that set, and if the frequency multiplier used within each device has substantially zero degrees of phase delay, then the devices in that set will have sampling clocks that are synchronous to each other, subject to the tolerance of the reference signal, their layout, and the respective sampling clock generation circuit used by each device. As such, a rising edge on the reference signal would correspond to a rising edge on the sampling clock of each device. Even though choosing the sampling clock frequency to be an integer multiple of a common reference signal may result in sampling clocks that are in phase from device to device (subject to various component and routing tolerances), it may not necessarily achieve a desired type of synchronization (e.g., digital synchronization). For example, in order to achieve digital synchronization between a set of instrumentation devices, trigger conditions should preferably affect every device in the set on the same edge of the sampling clock. If the frequency of the sampling clock is too high to reliably pass a bussed signal from one device to another, the trigger signals may either be sent in a slower clock domain than that of the sampling clock, such as the reference clock domain, or on a non-bussed means of sending the trigger signal (such as a point-to-point connection) may be used to send trigger signals.

In systems where the set of devices have sampling clock frequencies that are not integer multiples of the sampling clock frequency, achieving digital synchronization may be even more difficult. The reference clock signal seen by the devices in the set may have a low enough frequency that trigger signals clocked by the reference clock signal can be reliably passed from device to device. However, rising edges on the reference clock may not correspond to rising edges on the sampling clock since the frequency of the sampling clock is not an integer multiple of the reference clock. If the rising edges of the two clocks do not correspond (or if the phase relationship of the sampling clocks to the reference clock cannot be guaranteed), clocking trigger signals with the reference clock signal may ensure that devices of the same sampling clock frequency will see a trigger at roughly the same time. However, clocking trigger signals with the reference clock signal may not ensure that two devices will see the trigger assertion in the same sampling clock cycle.

To illustrate this point, assume two devices where each device includes a simple circuit for trigger transfer from the reference clock domain to the sampling clock domain, e.g., a first D flip-flop receives a trigger input (e.g., from a bus connecting several instrumentation devices), where the D flip-flop is clocked by the common reference signal (e.g., a 10 MHz signal). The output of D flip-flop is input to a second D flip-flop, which is clocked by the sample clock used by each device. Even if the sample clocks of the two devices are in phase, the trigger may not be seen in the same sampling clock cycle on both devices. The output of the first D flip-flop may change too close to the rising edge of the sampling clock, causing a setup violation because the input to the second D flip-flop has not been stable for the necessary setup time. This setup violation may cause the output of the second flip-flop to enter a state of metastability. When the metastability is finally resolved, it may resolve differently on each device, causing them to see the same transition in the trigger signal in different sampling clock cycles.

In some applications, multiple devices may be controlled by a single controller, where the devices can be made to appear as a single device as long as all devices can be triggered by the same signal. However, if each device has a separate trigger condition, it is not currently possible to combine the triggers asserted by the separate trigger conditions to create an integrated system trigger. This problem is compounded when the trigger conditions are temporary, such as a recognizing a digital pattern on a particular piece of data.

Current methods of achieving synchronization typically feature either sharing a physical periodic signal to which all the distributed systems are aligned, or to use a higher-level protocol to align the timebases of the distributed systems. Sharing a physical periodic signal provides tight synchronization as long as the periodic signal source is routed with identical delay to each distributed node. This method can achieve great results, but usually requires a multitude of wires or expensive wireless receivers to handle sharing the periodic signal and providing control signals (to start and stop data acquisitions for example.) Higher-level protocols vary in their capabilities, but generally require fewer wires, have poorer performance than periodic signals, and do not directly support the generation of synchronized periodic signals.

One high-level synchronization protocol that has historically provided reasonable performance is the IEEE-1588 (see IEEE std 1588-2002). While the IEEE-1588 standard provides a protocol for sending messages and precisely calculating deviation in timebases, it does not provide a mechanism for actually performing the synchronization between timebases. There is no mention of how to take the time deviation provided by the protocol and align remote timebases. In addition, there is a lack of direction on how to share periodic signals on multiple distributed units that are inherently synchronized according to the IEEE-1588 protocol. The standard does include the use of a pulse-per-second signal to test synchronization performance between remote units, but only covers the use of the seconds' boundary of the 1588 timebase to generate the signal. The standard does not disclose how to generate periodic signals at frequencies other than 1 Hz and how to start those periodic signals at the same time across 1588 remote devices.

While not specifically defined within the IEEE-1588 standard, there are two generally accepted applications of the IEEE-1588 protocol. The first is the notion of generating events at agreed upon future times. Such future time triggered events allow IEEE-1588 synchronized device networks to align events within their IEEE-1588 synchronization accuracy. In addition to these future time events, another common practice is to timestamp external events with the IEEE-1588 system time to obtain a precise time record that can be correlated to other devices within the IEEE-1588 synchronized network. Neither of these applications of the IEEE-1588 protocol discloses how to create periodic signals with arbitrary frequencies where those signals are synchronized on remote IEEE-1588 nodes, or how to create future time events with tighter synchronization than that which the IEEE-1588 protocol can offer.

SUMMARY OF THE INVENTION

Various embodiments of the present invention provide a system and method for aligning a local timebase to a remote timebase given a timebase error value from a higher-level protocol, and using the aligned timebases to generate and distribute synchronized events and synchronized adjustable frequency periodic signals across a domain using the aligned timebases. In one set of embodiments, these same events and periodic signals may be generated with even tighter synchronization than what may be provided by the aligned timebases. Slightly speeding up or slowing down a periodic signal used to count time, a local timebase may be aligned to a remote timebase when given an error value from a higher-level protocol. A Direct Digital Synthesizer (DDS) or Numerical Controlled Oscillator (NCO) may be used to finely adjust the frequency of its output signal. This signal, or a derivative, may then be used to clock circuitry that keeps count of time, herein referred to as a timekeeper. By correlating the error signal to a new frequency, time may be made up or lost in a smooth manner.

Once the timebases are aligned—e.g. as described above— synchronized events in a system may be generated according to various embodiments. In one set of embodiments, a device may be configured to begin generating a periodic waveform at an agreed upon time in the future, where the time may be synchronized to remote devices via a synchronization protocol and an alignment mechanism. The periodic waveform may be defined according to a start time and time period ($t_o + \Delta t$). Implementing $t_o$ as a future time event may facilitate multiple devices starting their periodic signals with phase alignment at an agreed upon future time. Remote periodic signals may remain synchronized to each other as long as the higher-level protocol and timebase alignment algorithm keep the timebases aligned. Duty cycle information may also be included as a defining parameter in addition $t_o$ and $\Delta t$. Thus, a third time parameter, $t_{duty}$ may be specified. When the time is between some multiple of to and $t_{duty}$, the signal may be in one portion of its cycle (active or non-active), and when the time is between $t_{duty}$ and the next multiple of $t_o$, the signal may be in the other portion of its cycle.

In another set of embodiments, a common reference periodic signal may be shared between all devices. The reference signal may be physically wired to all devices or it may be a wireless connection such as a GPS pulse-per-second signal. Once the devices are synchronized via a synchronization protocol and an alignment mechanism, their common timebase may be used to identify a particular edge or period of the common reference periodic signal that may occur at a future time. Devices may then synchronize their activities or generate synchronized periodic signals by starting the activity or periodic signal at a time when the agreed upon edge or period of the reference periodic signal arrives. Tight enough synchronization provided by the protocol may facilitate resolving a reference signal edge, leading to superior results, while in some applications it may be adequate to resolve a particular period of a reference signal. Care may need to be taken that the agreed upon reference signal edge is not too far ahead in time, otherwise a drift of the Master timekeeper from the reference periodic signal may cause the edge to be no longer agreed upon. Possible ways to address this issue may include operating the Master timekeeper to run its timekeeper off of the periodic reference signal, or setting the future time closer to the current time to eliminate drift and/or minimize drift, respectively.

In yet another set of embodiments, using a topology similar to the one described above, the reference periodic signal or a conditioned version of the reference periodic signal may be specified as the periodic signal to control the operation of the timebase circuitry. After allowing the synchronization protocol to align the timebases of the remote devices, the shared controlling periodic signal may ensure that the devices remain in tight synchronization. After synchronization is first achieved, devices may cease processing the higher-level synchronization protocol's messages. If a node stops receiving the reference periodic signal because of a fault, it may switch its controlling periodic signal to an onboard reference and use the higher-level synchronization protocol to maintain a level of synchronization. In this way, a more robust network may be designed by providing fail-safe synchronization even in the event of a failure of the shared periodic signal.

If the distributed reference clock is of a sufficiently low frequency, the higher-level protocol may be able to resolve time to a tighter resolution than the period of a reference clock. For example, if the higher-level protocol is capable of resolving time down to 20 ns, and the period of the reference clock is 100 ns, then the synchronization of the system may be subject to the skew of the reference clock. If the skew of the reference clock is 50 ns between two devices, the higher-level protocol may be able to detect the skew, but additional circuitry may be needed to also correct the skew. One possible solution may be to provide a PLL (phase locked loop) capable of adjusting the phase of an output periodic signal according to instructions from the timekeeper. Thus, the high-level protocol may be able to align the PLL outputs of two devices to within its resolution, in this example, 20 ns. Because the reference clock is distributed, the high-level protocol may not need to continue re-evaluating and re-synchronizing the system.

If the frequency of the distributed reference clock is high enough that its period is less than the resolution of the high-level protocol, then the high-level protocol may be capable of establishing the current time on each device in the system, setting up a future-time trigger, with all the devices selecting the closest reference clock edge to that future time. Reference clock skew may become less relevant as the high-level protocol's resolution becomes the dominant source of error. In addition, a low frequency reference clock may also use a PLL to create a higher frequency clock signal locked to the reference clock. Using the PLL output as the clock signal controlling the timebase, the synchronization method and accuracy may remain the same.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
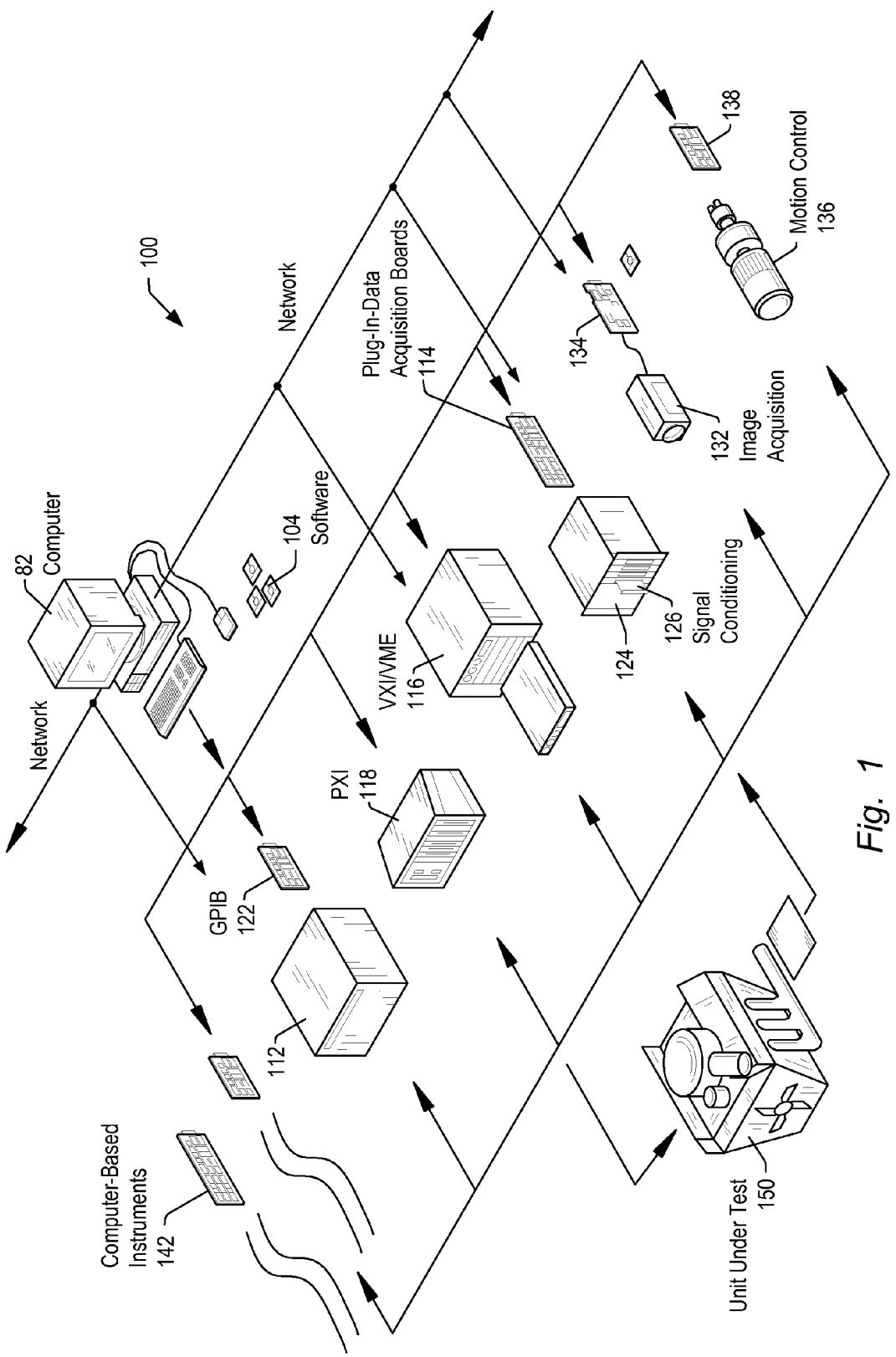
FIG. 1 illustrates an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
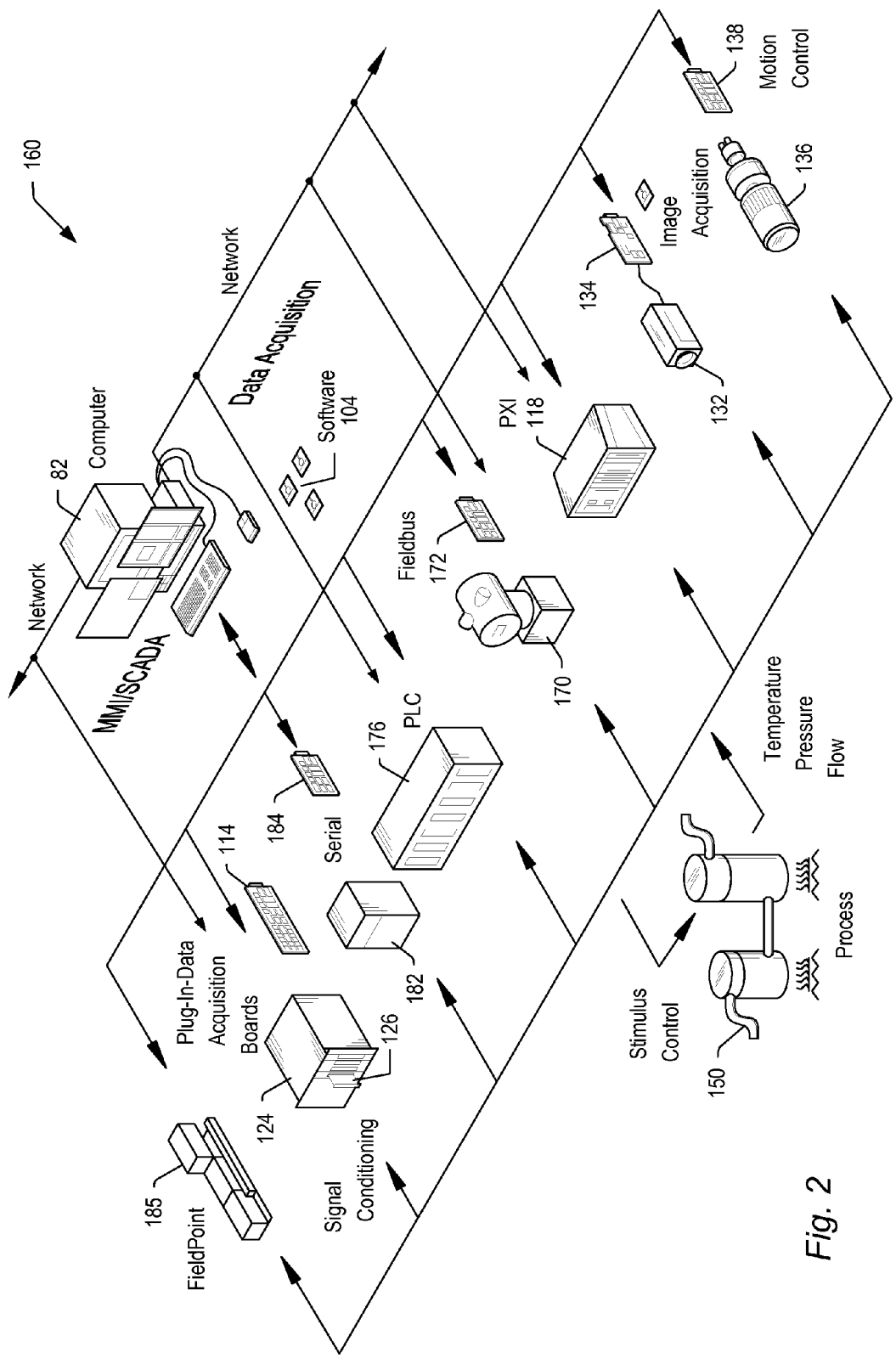
FIG. 2 illustrates an industrial automation system with instruments networked together according to one embodiment of the invention.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices. Various embodiments of the present invention provide a system and method for aligning a local timebase to a remote timebase given a timebase error value from a higher-level protocol, and using the aligned timebases to generate and distribute synchronized events and synchronized adjustable frequency periodic signals across a domain using the aligned timebases. The local and remote timebases in question may be present in computer 82 and/or any of the electronics comprised in the one or more devices and/or instruments illustrated in FIGS. 1 and 2. As shown in FIGS. 1 and 2, the instruments and computer 82 may be coupled together via the Networking connection (which may be an Ethernet connection), which may be at least partially used in aligning the timebases. Please note that actual connectivity of these instruments may differ from that shown in FIGS. 1 and 2, which merely illustrate one possible combination of connections. Alternate embodiments may feature more or less instruments coupled together via the Network connection.

In one set of embodiments, these same events and periodic signals may be generated with even tighter synchronization than what may be provided by the aligned timebases. Slightly speeding up or slowing down a periodic signal used to count time, a local timebase may be aligned to a remote timebase when given an error value from a higher-level protocol. A Direct Digital Synthesizer (DDS) or Numerical Controlled Oscillator (NCO) may be used to finely adjust the frequency of its output signal. This signal, or a derivative, may then be used to clock circuitry that keeps count of time, herein referred to as a timekeeper. Correlating the error signal to a new frequency, time may be made up or lost in a smooth manner.

Figure 3:
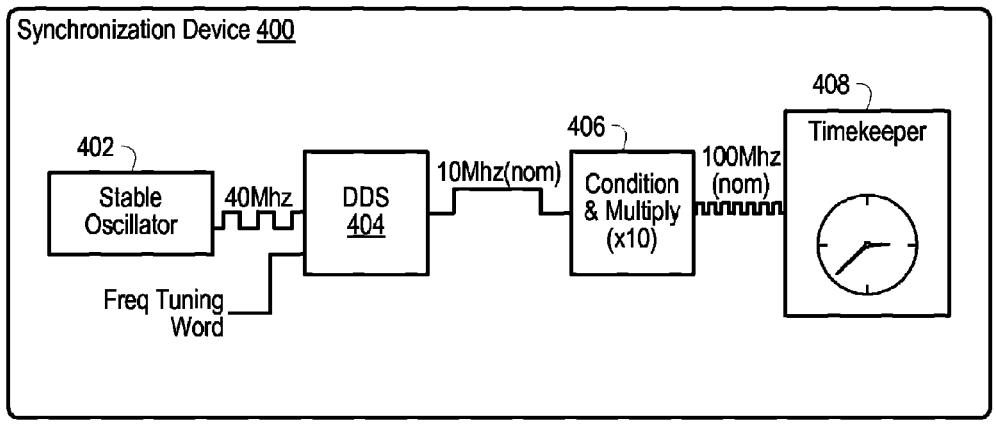
FIG. 3 shows one embodiment of a tunable timekeeper implemented with a direct digital synthesizer (DDS)

A synchronization protocol—e.g. IEEE-1588 or other higher-level protocol or protocols providing similar functionality—may provide an error signal indicating the deviation, if any deviation does occur, from the time of the synchronization master device. The error signal, when compared to prior error signals, may be used to infer differences in the rate of counting time and phase offsets between the times. To correct for rate errors and phase errors without skipping forward or backward in time, the rate of counting time may be increased or decreased accordingly. FIG. 3 shows a synchronization device 400 that may be configured to provide software with frequency adjustment capability. A Direct Digital Synthesizer (DDS) 404 may receive an input periodic signal—in this example a square wave input of 40 MHz, other embodiments may feature different periodic signals with different frequencies—and may produce an output with a frequency below one half of the input periodic signal's frequency. In the example shown in FIG. 3, DDS 404 outputs a square wave with a nominal frequency of 10 MHz, i.e. one fourth of the 40 MHz frequency of the input square wave. The output frequency may be finely tuned—e.g. devices with resolution of 0.01 Hz or smaller may commonly be used. In alternate embodiments, DDS 404 may be replaced by a Numerical Controlled Oscillator (NCO), which typically operates in a manner similar to DDS 404, being specifically geared toward the digital domain. Either DDS 404 or an NCO may be configured to provide tuning functionality.

If the input periodic signal comes from a stable source, e.g. a stable oscillator 402 as shown in FIG. 3, the output frequency may be adjusted—i.e. increased and/or decreased—to accurately compensate for rate and phase errors. Signal conditioning and/or multiplying circuitry 406 may be used to condition the periodic output signal into a square wave, and/or to multiply the nominal input frequency up to the frequency at which timekeeper device 408 counts time. As previously mentioned, in the embodiment of FIG. 3 a 40 MHz stable source oscillator 402 provides a periodic input signal to DDS 404, which in turn generates a precisely tunable periodic signal, nominally running at 10 MHz. The signal generated by DDS 404 may be conditioned and multiplied by circuitry 406 to a 100 MHz (nominal) signal. Now, upon every rising edge of the 100 MHz periodic signal, 10 ns may be added to the internal timebase of timekeeper device 408. By modifying the 10 MHz signal rate, software may establish control over the speed at which timekeeper device 408 may increment its timebase, thereby compensating for rate and phase errors. Since the adjustments made to the frequency of the (nominal) 10 MHz periodic signal may be minor adjustments, it is possible to compensate for the rate and phase errors in a very smooth manner, without skipping over time.

Because periodic signals are by definition repetitive, a starting time (to) and period ($\Delta t$) may be sufficient to specify a given periodic signal. Describing a periodic signal in software using a starting time and period may require building an array of time-based events according to the signal's period, and sending those time-based events to a memory element configured on a hardware target having time-based I/O capability. An alternate solution not requiring quite as much software and/or hardware memory may be to implement the ($t_o+\Delta t$) calculation in hardware.

One possible way of generating an adjustable periodic signal will now be described below.

Setting Up the Periodic Signal:
Set a Start Time ($t_o$) register with the desired start time of the adjustable periodic signal;
Program a Period ($\Delta t$) register with the desired period of the adjustable periodic signal ($T_{adjustable\_signal}$);
Program a Duty Cycle register with a value corresponding to a percentage of the desired period (i.e. a percentage of the value of the $\Delta t$ register).

The hardware may not proceed to generate the periodic signal until the IEEE-1588 system time reaches the designated start time (as stored in the $t_o$ register).

Generating the Periodic Signal:
(a) Output a rising edge and add the value of the Duty Cycle register to the value of the $t_o$ register;
(b) Wait until the timekeeper reaches the time obtained in (a);
(c) Output a falling edge and add the value of the $\Delta t$ register to the value of the to register, replacing the value in the to register;
(d) Wait until the timekeeper reaches the time obtained in (c);
(e) Repeat (a) through (d).

An alternate method of generating the periodic signal may be as follows.

Alternate Method for Generating the Periodic Signal:
(a) Output a rising edge and add the value of the $\Delta t$ register to the timekeeper's time, and separately add the value of the Duty Cycle register to the timekeeper's time;
(b) Wait until the timekeeper reaches the time corresponding to the sum of the value of the Duty Cycle register and the timekeeper's time obtained in (a);
(c) Output a falling edge;
(d) Wait until the timekeeper reaches the time corresponding to the sum of the value of the $\Delta t$ Register and the timekeeper's time obtained in (a);
(e) Repeat (a) through (d).

In this manner multiple devices synchronized via the IEEE-1588 protocol—or any other high level protocol providing similar functionality—may simultaneously start periodic signals of varying frequencies. Should those frequencies be the same, identical periodic signals may be distributed across an IEEE-1588 (high-level protocol) network. The synchronization performance may be tied to the synchronization ability of the given IEEE-1588 (high-level protocol) system. For best performance, it may be assumed that the IEEE-1588 (high-level protocol) system is synchronized and stable before generating periodic signals.

Figure 4:
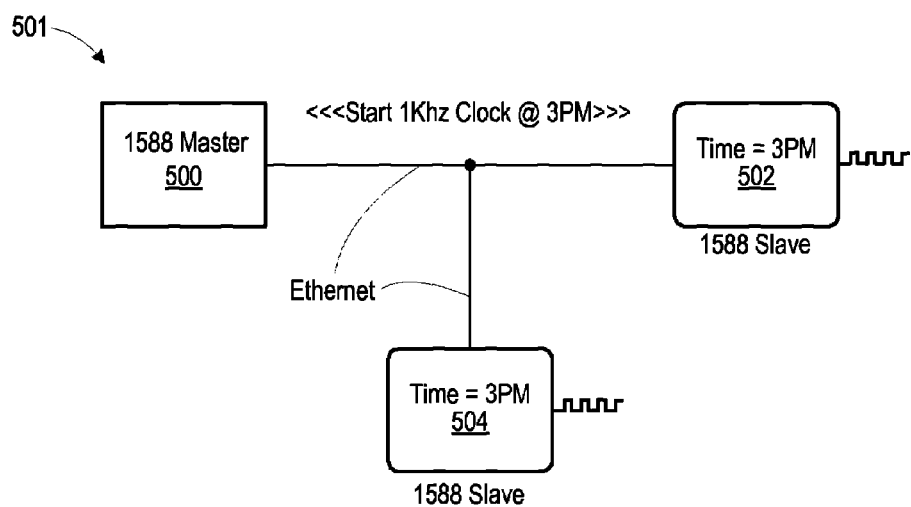
FIG. 4 shows one embodiment of periodic signal synchronization performed using only a high-level protocol like IEEE 1588 over Ethernet.

FIG. 4 shows one embodiment using Ethernet as the bus on which high-level protocol (e.g. IEEE-1588) synchronization takes place. System 501 may first synchronize all devices (in this case 500, 502, and 504) via the Master-to-Slave synchronization described in the higher-level protocol (in this case the IEEE-1588 protocol). Using a separate message not defined in the higher-level protocol, Master device 500 (in this case configured as a master device for the IEEE-1588 protocol) may send a request to Slave devices 502 and 504 (in this case configured as respective slave devices for the IEEE-1588 protocol) to start a 1 Khz signal at a future time of 3 PM. Slave devices 502 and 504 may wait until 3 PM to start generating the 1 Khz signal. This 1 Khz signal may now be synchronized between Slave devices 502 and 504 using only Ethernet as a wired connection—no periodic signals may need to be physically shared. Optionally, another future time may be specified to stop generating the 1 Khz signal. For instance, the slave devices may stop generating the 1 Khz signal at 3:01 PM, thus creating a 1 Khz pulse train for 60 seconds. It should be noted that the number of Master and Slave devices shown in FIG. 4 is for illustrative purposes only, and alternate embodiments may include a different number of these devices all achieving the same functionality.

Once the remote devices have synchronized timebases (or timekeepers), which may be accomplished via a higher-level protocol like IEEE-1588 (as described above), the remote devices may participate in synchronized events. In order to facilitate the synchronized events, each remote device may also be provided a reference periodic signal. The periodic signal may be sent across wires or it may be wirelessly provided to each remote device. For example, a global positioning system (GPS) may provide a pulse-per-second (PPS) signal that may be used as a reference signal. The delay of the periodic signal from the source to each remote destination would have to be substantially the same for all such devices for optimum performance. Remote devices may resolve a reference periodic signal edge by looking for such an edge after an agreed upon future time. As long as a higher-level synchronization protocol provides synchronization to within a time period less than a period of the reference signal, all the devices may use the same edge of the reference signal as the desired trigger. In this way, the synchronization of the event may depend mainly not on the ability of the synchronization protocol (such as the IEEE-1588 protocol), but on a much tighter performance of the shared reference periodic signal. In cases where the performance of the higher-level synchronization protocol may make it difficult—if at all possible—to reliably resolve a particular edge of the reference periodic signal, certain applications may find it acceptable to resolve a particular period of the reference signal. If the designated Master device for the synchronization protocol drifts relative to the reference clock signal, calling out a particular edge too far in the future may result in the drift of the Master device causing the edge to not be agreed upon. One way to resolve this while keeping the event far in the future may include configuring the Master device to run its timekeeper off of the reference periodic signal, effectively eliminating drift.

Figure 5:
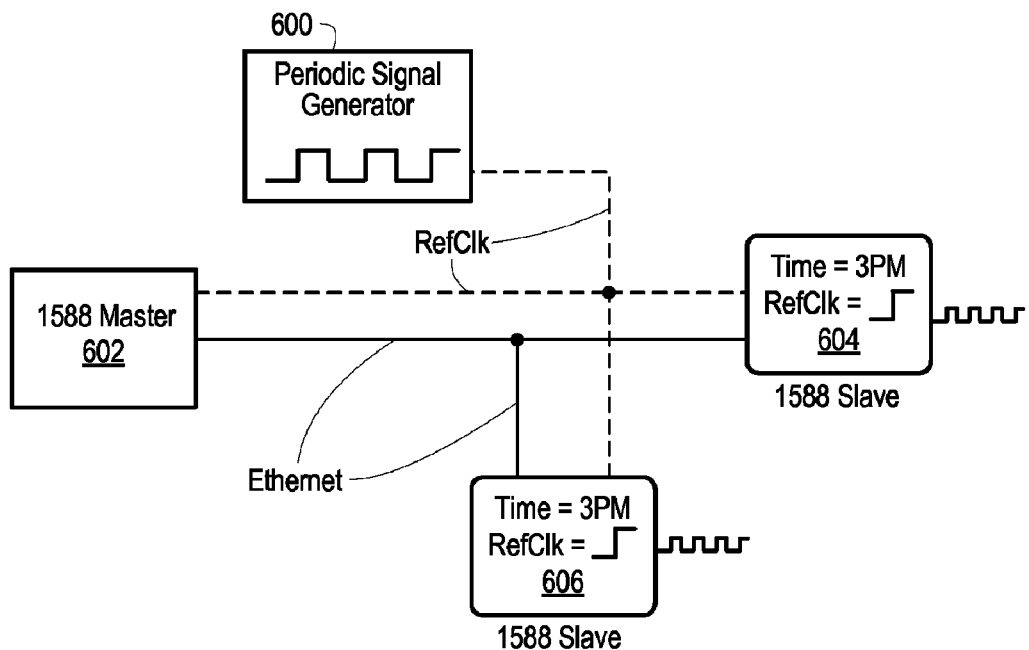
FIG. 5 shows one embodiment of periodic signal synchronization performed using a high-level protocol like IEEE 1588 over Ethernet, together with a reference periodic signal.

As seen in FIG. 5, two remote 1588 Slave devices 604 and 606 may start synchronized signals at the same rising edge of RefClk directly following 3 PM. Note that the future time value of 3 PM is shown for indicating the presence of a future, agreed upon time, and that the value of that time may be any designated time value. The amount of synchronization may depend on the system, and may be one half of the reference signal period, for example. The higher-level protocol (e.g. IEEE-1588 protocol) may be used to select the particular rising edge Slave devices 604 and 606 may use to start their respective periodic signals. In practice, the event occurring on the rising edge of RefClk may be any event that a user may wish to synchronize. Should the user wish to generate a synchronized periodic signal of some frequency, a different method may be preferable to maintain tight synchronization, since the periodic signals illustrated in FIG. 5 would be synchronized to the accuracy of the higher-level protocol (e.g. IEEE-1588 protocol).

As an alternative, periodic signal generation circuitry within Slave devices 604 and 606 may be configured to phase lock to the reference periodic signal (RefClk, or a derivative of RefClk), and Slave devices 604 and 606 may delay the start of their respective periodic signals until the resolved edge of the reference signal occurred. For wireless GPS operation, periodic signal generator 600 in FIG. 5 may be a GPS signal generator, and the dotted lines may represent wireless connections. Each designated Slave device for the higher-level protocol (e.g. Slave devices 604 and 606 for IEEE-1588 protocol) may require a GPS receiver to decode the PPS reference periodic signal (RefClk). Master device 602 may either select a future edge based on information from the current state of the reference periodic signal, or perform the same task but run its own timekeeper based on the reference periodic signal. In the latter case, the system may be immune to the drift that may exist between Master device 602 and the reference periodic signal. In the former case, care may need to be taken that a possible drift between Master device 602 and the reference periodic signal does not cause the resolved edge to be disagreed upon by Slave devices 604 and 606 (in other words, insuring that the resolved edge remains synchronized between Slave devices 604 and 606).

Figure 6:
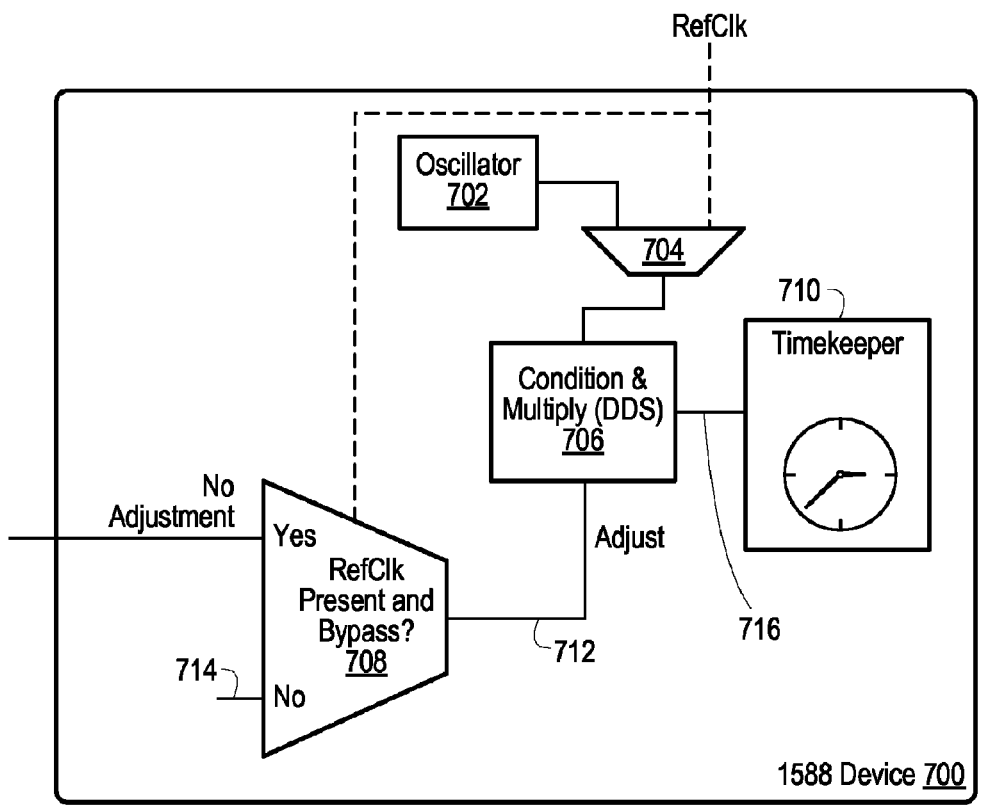
FIG. 6 shows one embodiment of periodic signal synchronization via a shared reference periodic signal used for control.

Another utilization of the topology shown in FIG. 5 may provide fault tolerance and allow the generation of synchronized timebase (timekeeper) triggered events without having to resolve a reference periodic signal edge. Instead of treating the shared reference periodic signal as an input, the shared reference signal may be used to control hardware circuitry used to implement the higher-level synchronization protocol. In FIG. 6, hardware circuitry 700 may be configured to support the higher-level synchronization protocol (in this case the IEEE-1588 protocol). In device 700, timekeeping may be controlled by a periodic signal 716, which may be a multiplied version (via Condition and Multiply DDS 706) of the shared reference periodic signal RefClk. When shared reference periodic signal RefClk is present, timekeeper 710 may be synchronized to other timebases on the network according to the higher-level protocol (in this case IEEE-1588 protocol signal 714) before being bypassed. Bypassing adjustments indicated by the IEEE-1588 protocol may allow device 700 to remain tightly synchronized with other remote devices being controlled by the same reference periodic signal RefClk. If shared reference periodic signal RefClk is not available, device 700 may use an on-board oscillator 702 instead of reference periodic signal input RefClk as the input into DDS 706, and the IEEE-1588 protocol may resume in order to maintain a level of synchronization.

A higher-level synchronization protocol such as the IEEE-1588 protocol is typically meant to compensate for different oscillators drifting apart and skewing their associated timebases (timekeepers). As illustrated in the configuration shown in FIG. 6, all remote nodes may be configured to execute of off (i.e. according to) the same RefClk, thereby eliminating potential drift. Once the IEEE-1588 protocol compensates for any potential skew in routing the reference periodic signal RefClk, the protocol's adjustment may safely be ignored (see adjustment signal 712 from block 708). From that point on, all remote devices may count time at the same rate and may therefore maintain tight synchronization. Events based on timekeepers (timebases) and periodic signal generation (as shown in FIG. 5, for example) may be generated with the same synchronization. Bypassing the higher-level protocol's adjustments as shown in FIG. 6 may be preferred to avoid rapid small adjustments stemming from inherent protocol system jitter.

A potential additional benefit of the system exemplified in FIG. 6 is fault tolerance. Should one or more of the reference periodic signal paths become disconnected, remote devices may simply switch their timekeeping periodic signal to an onboard reference signal and begin to use the higher-level synchronization protocol's adjustments to continue to maintain a level of synchronization. In this way, a system has the robust feature of a backup synchronization method, should the designated primary method fail.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method comprising:
  specifying a first time for generating respective periodic signals at a plurality of devices;
  synchronizing a current time of at least one slave device of the plurality of devices to a current time of a master device of the plurality of devices, according to a high level protocol, to obtain a synchronized current time of the at least one slave device;
  specifying a first period for the at least one slave device's respective periodic signal;
  specifying a first duty cycle for the at least one slave device's respective periodic signal; and
  the at least one slave device generating the respective periodic signal of the at least one slave device in accordance with the specified first time, the specified first period, and the specified first duty cycle, and based on the synchronized current time of the at least one slave device.

2. The method of claim 1, wherein said generating the respective periodic signal comprises:
  executing repeated additions using:
    the synchronized current time of the at least one slave device of the plurality of devices;
    the specified first period;
    the specified first duty cycle; and
    optionally the specified first time; and
  referencing to the synchronized current time of the at least one slave device to create a synchronized respective periodic signal of the at least one slave device.

3. The method of claim 1, wherein said specifying a first time comprises storing a value corresponding to the first time in a memory element.

4. The method of claim 1, wherein said specifying a first period comprises storing a value corresponding to the first period in a memory element.

5. The method of claim 1, wherein said specifying a first duty cycle comprises storing a value corresponding to a percentage of the specified first period in a memory element.

6. The method of claim 1, wherein said generating the respective periodic signal of the at least one slave device is not performed until a system time of the high level protocol reaches the specified first time.

7. The method of claim 1, wherein said generating the respective periodic signal of the at least one slave device is not performed until a system time of the high level protocol reaches the specified first time and the respective periodic signal ceases being generated at an optional specified end time.

8. The method of claim 1;
wherein said specifying a first time comprises storing a value corresponding to the first time in a first memory element;
wherein said specifying a first period comprises storing a value corresponding to the first period in a second memory element; and
wherein said specifying a first duty cycle comprises storing a value corresponding to the first duty cycle in a third memory element.

9. The method of claim 8, wherein said generating the respective periodic signal of the at least one slave device comprises:
(a) outputting a rising edge and adding a current value of the third memory element to a current value of the first memory element to obtain a first next time value;
(b) waiting until a present time reaches the first next time value;
(c) outputting a falling edge and adding a current value of the second memory element to the current value of the first memory element to obtain a second next time value;
(d) replacing the current value in the first memory element with the second next time value; and
(e) waiting until the present time reaches the second next time value.

10. The method of claim 9, further comprising performing (a) through (e) a plurality of times.

11. The method of claim 8, wherein said generating the respective periodic signal of the at least one slave device comprises:
(a) outputting a rising edge;
(b) adding a current value of the third memory element to a present time to obtain a first next time value;
(c) adding a current value of the second memory element to the present time to obtain a second next time value;
(d) waiting until the present time reaches the first next time value;
(e) outputting a falling edge; and
(f) waiting until the present time reaches the second next time value.

12. The method of claim 11, further comprising performing (a) through (h) a plurality of times.

13. The method of claim 1, further comprising providing a reference periodic signal to each of the plurality of devices.

14. The method of claim 13, further comprising:
specifying a task for one or more devices of the plurality of devices to perform;
specifying a number of periods of the reference periodic signal or a particular signal edge of the reference periodic signal
the one or more devices performing the task substantially synchronously at the specified number of periods or at the particular reference periodic signal edge after the specified first time.

15. The method of claim 14, further comprising resolving the particular signal edge according to the higher level protocol, wherein in response to said resolving, said performing the task is performed with more accurate synchronization than the high level protocol can provide.

16. The method of claim 14, further comprising:
each device of the plurality of devices deriving a respective second periodic signal, wherein the respective second periodic signal is phase locked to the reference periodic signal;
each device of the plurality of devices using an edge or period of the derived periodic signal to perform the task.

17. The method of claim 16, wherein the respective second periodic signal's period is less than the synchronization performance of the high level protocol.

18. The method of claim 17, further comprising applying synchronous tasks to a nearby period of the respective second periodic signal to provide a level of synchronous performance with the benefit of no drift.

19. The method of claim 13, further comprising:
each slave device of the plurality of devices adjusting to the reference periodic signal according to the higher level protocol to generate a respective adjusted reference periodic signal, wherein said adjusting for any given slave device synchronizes the given slave device with other ones of the slave devices.

20. The method of claim 19, further comprising:
each of the slave devices and/or master device of the plurality of devices executing according to the adjusted reference periodic signal without need for further adjustments from the high level protocol.

21. The method of claim 20, further comprising:
if the reference periodic signal becomes unavailable, each slave device and/or master device of the plurality of devices executing and synchronizing a respective onboard timekeeper with respect to respective onboard timekeepers of other ones of the slave devices and/or master device of the plurality of devices, according to the high level protocol, to maintain a level of synchronization and provide reference periodic signal fault tolerance.

22. The method of claim 20, wherein synchronous tasks are applied at an agreed upon time to provide a level of synchronous performance with the benefit of no drift between higher level protocol synchronization messages.

23. A system comprising:
a first device comprising a first timekeeper circuit;
a second device coupled to the first device and comprising a second timekeeper circuit, wherein the second timekeeper circuit is configured to synchronize with the first timekeeper circuit according to a high-level protocol, wherein the second device is further configured to generate a third periodic signal beginning at a previously specified starting time, and according to a previously specified period for the third periodic signal and/or a previously specified duty cycle for the third periodic signal.

24. The system of claim 23 further comprising one or more of:
a first register configured to store the previously specified starting time;
a second register configured to store the previously specified period; and
a third register configured to store the previously specified duty cycle.

25. The system of claim 23, further comprising a plurality of slave devices, each of the plurality of slave devices comprising a respective timekeeper circuit configured to synchronize with the first timekeeper circuit according to the high-level protocol.

26. The system of claim 25, wherein each of the plurality of slave devices is configured to generate a respective periodic signal beginning at the previously specified starting time, and according to the previously specified period for the third periodic signal and/or the previously specified duty cycle for the third periodic signal.

27. The system of claim 25, wherein each of the plurality of slave devices is configured to generate a respective periodic signal beginning at a previously specified respective starting time for the respective periodic signal, and according to a previously specified respective period for the respective periodic signal and/or a previously specified duty cycle for the respective periodic signal.

28. The system of claim 23, wherein the first device and the second device are configured to receive a reference periodic signal, wherein the first timekeeper circuit and the second timekeeper circuit are configured to be controlled by the reference periodic signal;
wherein the first device and the second device each comprise a respective bypass circuit configured to bypass the high-level protocol after the second timekeeper circuit has been synchronized with the first timekeeper circuit according to the high-level protocol.

29. The system of claim 23, wherein the first device comprises:
a first oscillator configured to generate a first periodic base signal; and
a first scaling circuit configured to generate a first periodic reference signal based on the first periodic base signal to control the first timekeeper circuit.

30. The system of claim 29, wherein the second device comprises:
a second oscillator configured to generate a second periodic base signal; and
a second scaling circuit configured to generate a second periodic reference signal based on the second periodic base signal to control the second timekeeper circuit.

31. A method for synchronizing events between distributed devices, wherein each device of the distributed devices comprises a respective timebase, and is configured to generate a respective first periodic signal having an adjustable frequency, the method comprising:
providing a timebase error value from a high-level protocol to each device of the distributed devices;
the distributed devices aligning their respective timebases according to the timebase error value to obtain aligned respective timebases;
generating and distributing synchronized events across the distributed devices based on the aligned respective timebases; and
the distributed devices synchronizing their respective first periodic signals according to the aligned respective timebases.

32. The method of 31, wherein the distributed devices aligning their respective timebases comprises the distributed devices slightly speeding up or slowing down respective second periodic signals used to count time, according to the timebase error value from the high-level protocol.

33. The method of claim 31, further comprising:
one or more of the plurality of distributed devices beginning generating a respective periodic waveform at an agreed upon time, once the distributed devices have completed aligning their respective timebases.

34. The method of claim 31, further comprising:
providing a common reference periodic signal to at least a subset of the distributed devices; and
using the reference periodic signal or a conditioned version of the reference periodic signal to control operation of the respective timebases of the at least a subset of the distributed devices.

* * * * *